(12) United States Patent
Tatsumura et al.

(10) Patent No.: US 9,025,373 B2
(45) Date of Patent: May 5, 2015

(54) NON-VOLATILE PROGRAMMABLE SWITCH

(71) Applicant: Kabushiki Kaisha Toshiba, Tokyo (JP)

(72) Inventors: Kosuke Tatsumura, Kanagawa (JP); Koichiro Zaitsu, Kanagawa (JP); Mari Matsumoto, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 13/776,416

(22) Filed: Feb. 25, 2013

(65) Prior Publication Data

US 2014/0022840 A1   Jan. 23, 2014

(30) Foreign Application Priority Data

Jul. 17, 2012   (JP) ................. 2012-158687

(51) Int. Cl.
| | |
|---|---|
| *G11C 11/34* | (2006.01) |
| *H01L 27/088* | (2006.01) |
| *G11C 11/40* | (2006.01) |
| *H01L 21/28* | (2006.01) |
| *H01L 27/118* | (2006.01) |
| *H01L 27/115* | (2006.01) |

(52) U.S. Cl.
CPC ............. *H01L 27/088* (2013.01); *G11C 11/40* (2013.01); *H01L 21/28273* (2013.01); *H01L 21/28282* (2013.01); *H01L 27/1156* (2013.01); *H01L 27/11803* (2013.01)

(58) Field of Classification Search
CPC .................. H01L 27/28273; H01L 27/28282; H01L 27/11519; G11C 11/40

USPC ................... 365/184, 185.01, 185.28, 185.26
See application file for complete search history.

(56) References Cited

U.S. PATENT DOCUMENTS

| | | | |
|---|---|---|---|
| 5,812,450 | A | 9/1998 | Sansbury et al. |
| 5,923,184 | A * | 7/1999 | Ooms et al. ..................... 326/50 |
| 6,002,610 | A | 12/1999 | Cong et al. |
| 6,252,273 | B1 * | 6/2001 | Salter et al. ................... 257/316 |
| 6,894,340 | B2 * | 5/2005 | Kuo et al. ...................... 257/315 |
| 6,970,383 | B1 * | 11/2005 | Han et al. ................. 365/185.28 |
| 6,972,986 | B2 | 12/2005 | Peng et al. |
| 7,129,749 | B1 | 10/2006 | Fenstermaker et al. |

(Continued)

FOREIGN PATENT DOCUMENTS

| | | |
|---|---|---|
| JP | 10-096802 A | 4/1998 |
| JP | 2001-074914 A | 3/2001 |

(Continued)

OTHER PUBLICATIONS

Japanese Office Action, Patent Application No. 2012-048147, dated Jan. 14, 2014.

*Primary Examiner* — Viet Q Nguyen

(74) *Attorney, Agent, or Firm* — Patterson & Sheridan, LLP

(57) ABSTRACT

According to one embodiment, a non-volatile programmable switch according to this embodiment includes first and second non-volatile memory transistors, and a common node that is connected to the output side terminals of the first and second non-volatile memory transistors, and a logic transistor unit that is connected to the common node. A length of a gate electrode of the first and second non-volatile memory transistors in a channel longitudinal direction is shorter than a length of the charge storage film in the channel longitudinal direction.

12 Claims, 10 Drawing Sheets

(56) References Cited

U.S. PATENT DOCUMENTS

| | | | |
|---|---|---|---|
| 7,430,137 B2* | 9/2008 | Greene et al. | 365/185.05 |
| 7,590,000 B2* | 9/2009 | McCollum et al. | 365/185.08 |
| 7,742,336 B2* | 6/2010 | Ogura et al. | 365/185.03 |
| 7,750,332 B2* | 7/2010 | Sakamoto et al. | 257/2 |
| 7,764,081 B1 | 7/2010 | Tuan et al. | |
| 8,552,763 B2* | 10/2013 | Abe | 326/119 |
| 8,710,572 B2* | 4/2014 | Ishihara et al. | 257/316 |
| 8,779,799 B2* | 7/2014 | Takewaki | 326/106 |
| 2013/0307054 A1* | 11/2013 | Yasuda et al. | 257/326 |
| 2014/0035619 A1* | 2/2014 | Zaitsu et al. | 326/41 |

FOREIGN PATENT DOCUMENTS

| | | |
|---|---|---|
| JP | 2001-330709 A | 11/2001 |
| JP | 2002-277610 A | 9/2002 |
| JP | 2003-202411 A | 7/2003 |

* cited by examiner

NON-VOLATILE PROGRAMMABLE SWITCH

CROSS-REFERENCE TO RELATED APPLICATION

This application is based upon and claims the benefit of priority from Japanese Patent Application No. 2012-158687, filed Jul. 17, 2012; the entire contents of which are incorporated herein by reference.

FIELD

Embodiments described herein relate generally to a non-volatile programmable switch.

BACKGROUND

A non-volatile programmable switch includes a configuration memory and a switch transistor, and controls the ON/OFF of the switch transistor according to the data retained in the configuration memory. A non-volatile programmable switch is used in, for example, FPGA (Field Programmable Gate Array) that reconfigures logical circuits and wiring circuits.

Here, for the configuration memory, a configuration that includes two non-volatile memory transistors is known. In this configuration, two non-volatile memory transistors are connected in series, and their contact point becomes the output node of the configuration memory. This output node is connected to the gate of a switch transistor.

A non-volatile programmable switch is required to be manufactured as minutely as possible in order to reduce the silicon surface area. Generally, when miniaturizing non-volatile memory transistors, it becomes difficult to achieve sufficient write/erase characteristics. In the field of high-capacity memory (high density storage), various technologies to improve the write/erase characteristics of non-volatile memory transistors have been proposed. However, there are cases where the technology used for high-capacity memory cannot be applied to the non-volatile memory transistors of non-volatile programmable switches. This is because the non-volatile memory transistors of non-volatile programmable switches and the non-volatile memory transistors of high-capacity memory are generally different in terms of operating conditions as well as configurations, and element dimensions.

DETAILED DESCRIPTION

Figure 1:
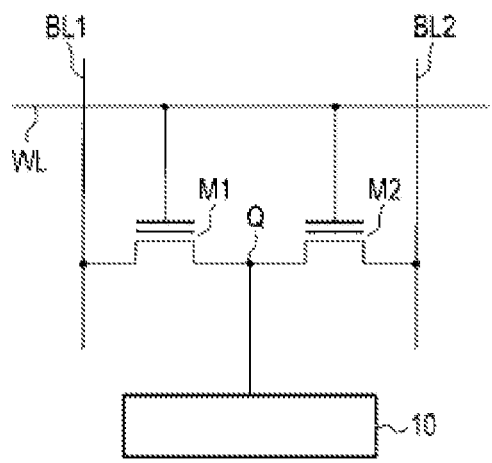
FIG. 1 is a diagram of a non-volatile programmable switch.

This disclosure describes a configuration for non-volatile programmable switches that has good write/erase characteristics even when miniaturized and a method for write/erase a non-volatile programmable switch. In general, embodiments of the present disclosure are described with reference to the drawings.

According to an embodiment, a non-volatile programmable switch includes a first non-volatile memory transistor that includes a first input side terminal, a first output side terminal, a first channel in between the first input side terminal and the first output side terminal, a first lower part insulating film on the first channel, a first charge storage film on the first lower part insulating film, a first upper part insulating film on the first charge storage film, and a first gate electrode on the first upper part insulating film; a second non-volatile memory transistor that includes a second input side terminal, a second output side terminal, a second channel in between the second input side terminal and the second output side terminal, a second lower part insulating film on the second channel, a second charge storage film on the second lower part insulating film, a second upper part insulating film on the second charge storage film, and a second gate electrode on the second upper part insulating film; a first data line that is connected to the first input side terminal; a second data line that is connected to the second input side terminal; a common node that is commonly connected to the first and second output side terminals; and a logic transistor unit that is connected to the common node; wherein a length of the first gate electrode in a channel longitudinal direction is shorter than a length of the first charge storage film in the channel longitudinal direction, and a length of the second gate electrode in the channel longitudinal direction is shorter than a length of the second charge storage film in the channel longitudinal direction.

A first non-volatile memory transistor M1 includes a first input side terminal, a first output side terminal, a first channel between the first input side terminal and the first output side terminal, a first lower part insulating film on the first channel, a first charge storage film on the first lower part insulating film, a first upper part insulating film on the first charge storage film, and a first gate electrode on the first upper part insulating film.

A second non-volatile memory transistor M2 includes a second input side terminal, a second output side terminal, a second channel between the second input side terminal and the second output side terminal, a second lower part insulating film on the second channel, a second charge storage film on the second lower part insulating film, a second upper part insulating film on the second charge storage film, and a second gate electrode on the second upper part insulating film.

The first input side terminal on the first non-volatile memory transistor M1 is connected to a first data line BL1, and the second input side terminal on the second non-volatile memory transistor M2 is connected to a second data line BL2.

The first output side terminal of the first non-volatile memory transistor M1 and the second output side terminal of the second non-volatile memory transistor M2 are connected to a common node Q. The common node Q is connected to a logic transistor unit 10.

During the operation of the non-volatile programmable switch (e.g., during FPGA operation), one of the non-volatile memory transistors M1 or M2 is put in a write state and the other in an erase state. A word line WL1 is set to a read voltage that is higher than a threshold voltage of the memory transistor in the erase state and lower than a threshold voltage of the memory transistor in the write state. One of the data lines BL1 or BL2 is set to a high voltage (for example, power-supply voltage Vdd) as the "H (High)" level, and the other is set to a low voltage (for example ground voltage Vss) as the "L (Low)" level.

With this, the high voltage "H" or the low voltage "L" is transferred to the logic transistor unit 10, via the memory transistor that is in the erase state, of the non-volatile memory transistors M1 and M2.

Meanwhile, in the present example, the first gate electrode of the first non-volatile memory transistor M1 and the second gate electrode of the second non-volatile memory transistor M2 are commonly connected to the word line WL. However, instead of this, the first gate electrode of the first non-volatile memory transistor M1 and the second gate electrode of the second non-volatile memory transistor M2 can also be mutually separated electrically.

Figure 2:
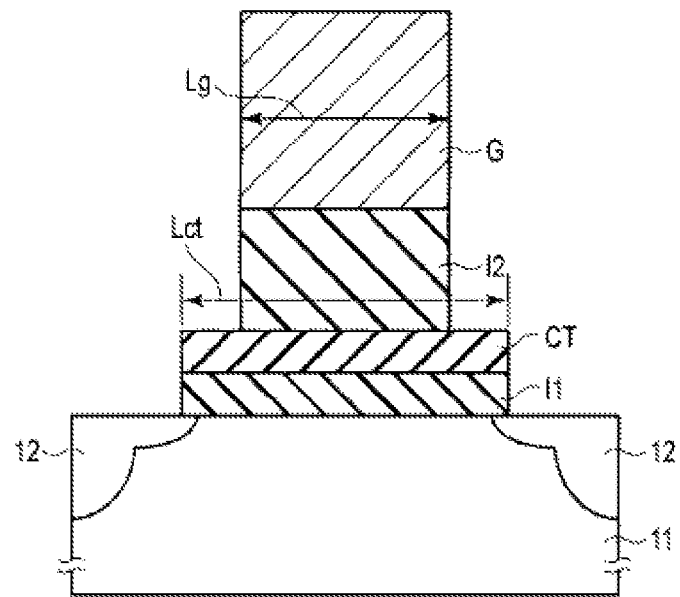
FIG. 2 is a diagram of a non-volatile memory transistor.

FIG. 2 shows a configuration example of the first and second non-volatile memory transistors M1 and M2 in FIG. 1. Both the first and the second non-volatile memory transistors M1 and M2 are manufactured so that they are generally the same in configuration. That is, if the processing variation during manufacture is not considered, the first and second non-volatile memory transistors M1 and M2 have the same structure.

In the present example, the non-volatile memory transistor includes an impurity region (input side terminal or output side terminal) 12 in a semiconductor substrate (can also be a well in a substrate) 11 and a lower part insulating film I1 on the channel between the impurity regions 12 and a charge accumulating film CT on the lower part insulating film I1, and an upper part insulating film I2 on the charge accumulating film CT, and a gate electrode G on the upper part insulating film I2. This non-volatile memory transistor stores data with the charge that is accumulated in the charge accumulating film CT.

A length Lg of the gate electrode G of the non-volatile memory transistor in the channel longitudinal direction is shorter than a length Lct of the charge storage film. CT of the non-volatile memory transistor in the channel longitudinal direction. In the present embodiment, Lg=35 nm, Lct=55 nm, ΔL=Lct−Lg=20 nm.

The aim of this is to make the capacitive coupling of the charge storage film CT and the gate electrode G small by making Lg shorter than Lct. Thus, when applying a constant voltage to the gate electrode, to make the electrical field that is impressed on the upper part insulating film I2 bigger than the electrical field that is impressed on the lower part insulating film I1. That is, when a constant voltage is applied to the gate electrode G, the aim is to suppress an FN (Fowler-Nordheim) tunneling current that is generated between the channel and the charge storage film CT, and to augment an FN tunneling current that is generated between the charge storage film CT and the gate electrode G.

In the present example, this FN tunneling current that is generated between the charge storage film CT and the gate electrode G is utilized for the data erase on the non-volatile programmable switch. On the other hand, for the data write on the non-volatile programmable switch, channel hot electron (CHE) injection is utilized. Details regarding this will be elaborated in the explanation of the write/erase operations.

In the non-volatile memory transistor of this example, the lower part insulating film I1 shall be a laminated film of $SiO_2$ (2.2 nm)/SiN (0.5 nm)/$SiO_2$ (2.3 nm), the charge storage layer CT shall be SiN (4.3 nm), and the upper part insulating film I2 shall be a laminated film of $SiO_2$ (3.4 nm)/SiN (2.7 nm)/$SiO_2$ (3.4 nm)/SiN (2.3 nm). Here the notation "A/B" means that A is the lower layer and B is the upper layer, and the numbers inside the parentheses indicate the layer thicknesses.

In this case, the film thickness T1 of the lower part insulating film I1, that is the total layer thickness of each layer of the laminated film, becomes 5.0 nm, and the film thickness T2 of the upper part insulating film I2 becomes 11.7 nm.

Here, the mean $\epsilon_{AVE}$ of a relative permittivity of the insulating film that has a laminate structure with n (≥1) layers can be represented using the following formula, when Tj is a layer thickness of the jth (n≥j≥1) layer, and the relative permittivity is $\epsilon j$.

$$\varepsilon_{ave} = \frac{\sum_{j=1}^{n} T_j}{\sum_{j=1}^{n} T_j/\varepsilon_j} \quad \text{[Formula 1]}$$

The relative permittivity of $SiO_2$ is 3.9, and the relative permittivity of SiN is 7.9, which makes the average relative permittivity $\epsilon1$ of the lower part insulating film I1 4.11 and the average relative permittivity $\epsilon2$ of the upper part insulating film I2 4.97.

In the present example, the lower part insulating film I1 and the upper part insulating film I2 are laminated film of $SiO_2$ and SiN, but instead of these, at least one of the high-permittivity film (high-k film) such as Al oxides, Hf oxides, Zr oxides, Ta oxides, Ti oxides, La oxides, and their compounds, or a laminated film that sandwiches the high-k film with $SiO_2$ or SiN, or, a laminated film of a high-k film and $SiO_2$ or SiN, can be used.

The charge storage film CT is, for example, a SiN film with a silicon-rich composition. If a molar ratio of N to Si in the SiN film (N/Si) is x, then the stoichiometric composition SiN ($Si_3N_4$) is, x=1.33. With the silicon-rich composition $SiN_x$, it becomes x<1.33. The smaller the x is, which is less than 1.33, the uncombined hand (dangling bond) of the Si atoms increases, and the electron capturing capability improves.

Meanwhile, the non-volatile memory transistor of the present example is a MONOS (Metal-Oxide-Nitride-Oxide-Semiconductor)-type non-volatile memory transistor that uses SiN as the charge storage film. CT. Instead of this SiN layer, polysilicon, or a polysilicon that has been doped with n-type impurities, or a polysilicon that has been doped with p-type impurities may be used as the charge storage film CT. In this case, the non-volatile memory transistor of the present example becomes a floating gate-type (FG type) non-volatile memory transistor. Also, the charge storage film CT can be a laminate structure of polysilicon and SiN film. Furthermore, the charge storage film CT can also have an insulator layer that includes a microparticle (dot) that is made of metal or a semiconductor.

The gate electrode G of the present example is a polysilicon. The gate electrode G can be a metal material (metal gate technology), instead of polysilicon. In the case that the gate electrode G is a metal material, for the metal material, a high melting point metal, such as tantalum, titanium, tungsten, and molybdenum, or carbides, nitrides, or aluminum compounds of these metals can be used. For example, TaC, TaN, TiN, TiCN, TiAlN, W, W, Mo can be used as the gate electrode G.

The material, composition, and the film thicknesses of the lower part insulating film I1, the charge storage film CT, and the upper part insulating film I2 and the gate electrode G can be made clear, for example, by cutting out the pertinent section from the non-volatile memory transistor with the pickup method using FIB (Focused Ion Beam) and taking an image of its cross-section with a High Resolution Transmission Electron Microscope (HRTEM), or by analyzing it with Energy Dispersive X-ray Analysis (EDX), Electron Energy-Loss Spectroscopy (EELS), or three-dimensional Atom Probe Field Ion Microscopy (3DAP-FIM).

Figure 3:
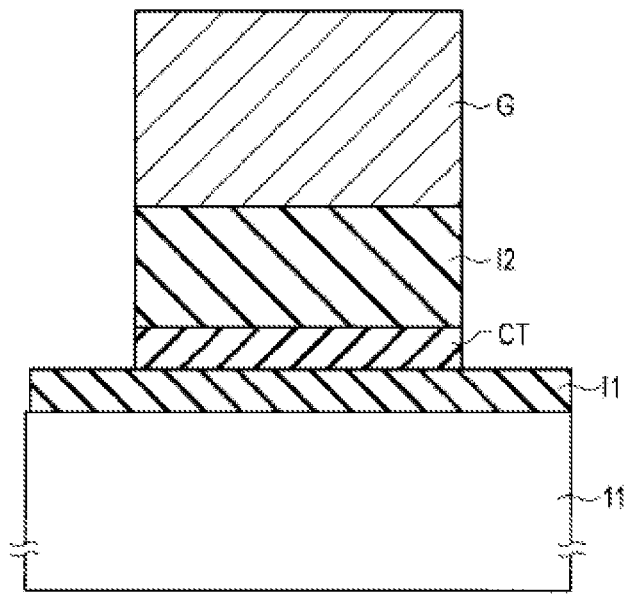
FIG. 3 to FIG. 5 depict certain steps of a manufacturing method for a non-volatile memory transistor.
Figure 4:
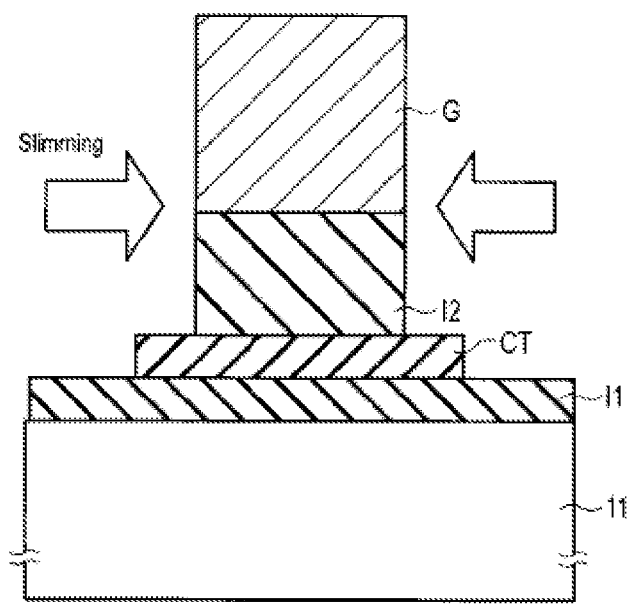
Figure 5:
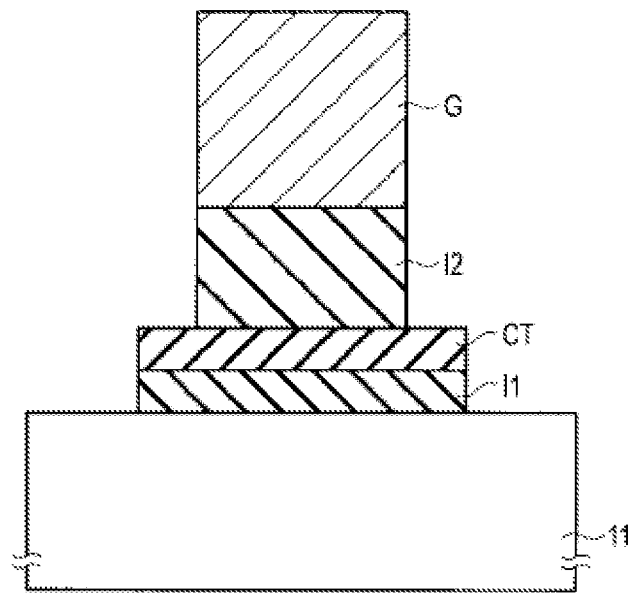

FIG. 3 through FIG. 5 depict a manufacturing method used to fabricate the non-volatile memory transistor of FIG. 2.

First, as shown in FIG. 3, the lower part insulating film I1, charge storage film CT, upper part insulating film I2, and the gate electrode G are, sequentially, formed on the semiconductor substrate 11.

After this, using a patterned mask material as the etch mask, etching of the gate stack structure by RIE (Reactive Ion Etching) is conducted. In the present example, the gate electrode G, the upper part insulating film I2, and the charge storage film CT are etched, while the lower part insulating film I1 is not etched. However, in this step, it is permissible in the present example to also etch a part of the lower part insulating film I1.

Next, as shown in FIG. 4, a slimming (trimming) process on the gate electrode G is carried out.

The present example used a slimming process that includes an oxidation process on the side surface of the gate electrode G by the plasma oxidation process, and a process to eliminate the oxides that are formed on the side surface of the gate electrode G by wet etching using hydrofluoric acid.

Separately, when the gate electrode G is a polysilicon, it is possible to carry out a slimming process in which the gate electrode G is selectively etched using an organic alkaline solution that includes, for example, choline (2-hydroxy ethyl trimethyl ammonium hydroxide).

In the present example, with the slimming process, slimming of the upper part insulating film I2 is carried out alongside the slimming of the gate electrode G, but regarding the upper part insulating film I2, it may be, but does not have to be, slimmed.

Next, as shown in FIG. 5, using the charge storage film CT as the mask, patterning of the lower part insulating film I1 is carried out by a wet process, for example.

With the manufacturing method above, a non-volatile memory transistor with which the length Lg of the gate electrode G in the channel longitudinal direction is shorter than the length Lct of the charge storage film CT in the channel longitudinal direction can be formed. According to this process, the memory transistor of FIG. 2 can be easily and inexpensively manufactured.

Figure 6:
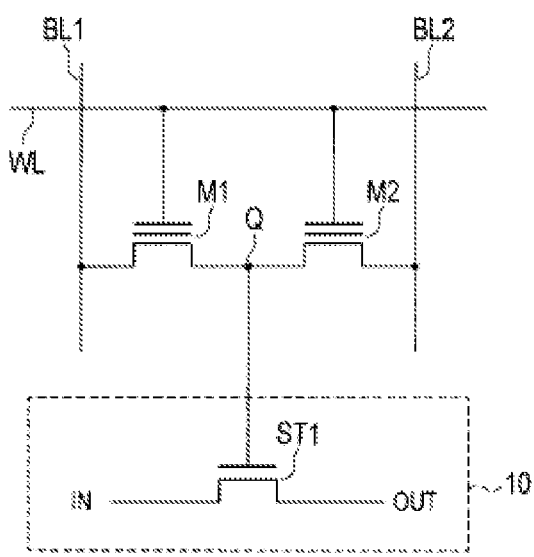
FIG. 6 is a diagram of an example of a logic transistor unit.
Figure 7:
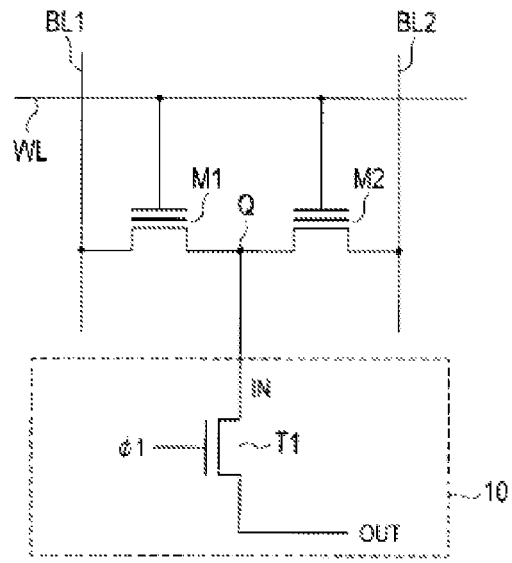
FIG. 7 is a diagram of an example of the logic transistor unit.

FIG. 6 and FIG. 7 show an example of the logic transistor unit 10 in FIG. 1.

In the example in FIG. 6, the common node (the output node of the configuration memory) is connected to the gate electrode of the FET (Field Effect Transistor). This FET is called a switch transistor ST, and it determines whether a signal of an input IN is transferred to an output OUT or blocked, according to the configuration data that is outputted from the common node Q.

In the present example, the common node Q is connected to the gate electrode of one switch transistor ST, but it may be connected to the gate electrodes of multiple switch transistors. Also, the switch transistor ST can be either an N channel FET or a P channel FET. Furthermore, the common node Q can be connected to an input terminal of an inverter that includes an N channel FET and a P channel FET.

In the example of FIG. 7, the common node (the output node of the configuration memory) is connected to one of either the source terminal or the drain terminal of the FET. This FET functions as a switch transistor T1 that decides whether to transfer the configuration data IN that is outputted from the common node Q to the output OUT or to block it, according to the control signal φ1. This switch transistor T1 constitutes, for example, a part of the LUT (Look-up table).

In the present example, the common node Q is connected to the source terminal/drain terminal of one switch transistor T1, but it can be connected to the source terminals/drain terminals of multiple switch transistors. Also, the switch transistor T1 can be either an N channel FET or a P channel FET. Furthermore, the common node Q may be connected to the source terminal/drain terminal of the switch transistor T1 after going through an inverter.

The switch transistor of the present example is a MOS (Metal-Oxide-Silicon)-type field-effect transistor that has a 2-nm SiON film as the gate insulating film. According to the write method of the present embodiment mentioned below, since the voltage that is applied to the switch transistor during the write operation is small, it is possible to employ a high-speed switch transistor that has an ultrathin gate insulating film with a low breakdown voltage.

(Write Operation)

Figure 8:
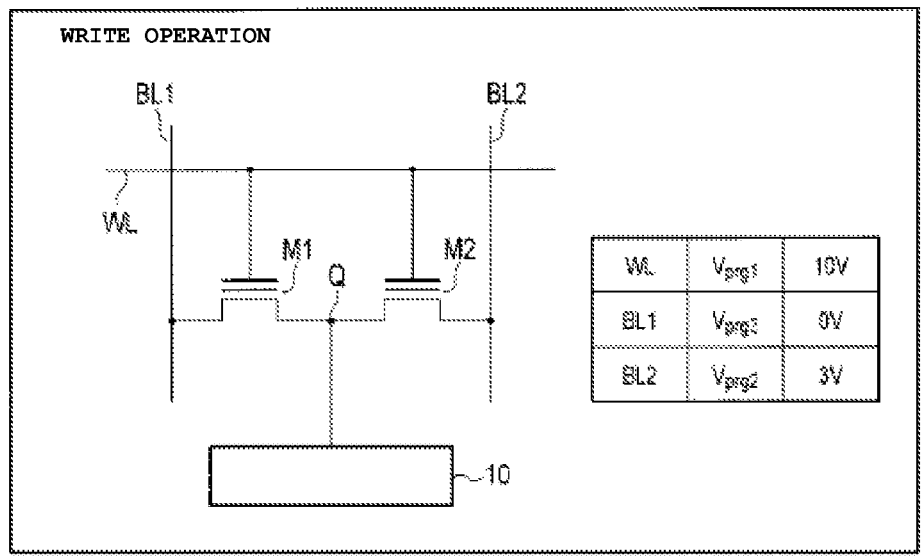
FIG. 8 is a diagram depicting a write operation.

FIG. 8 shows the write operation of the non-volatile programmable switch.

In the present example, data write can be carried out selectively by utilizing a channel hot electron (CHE) injection.

For example, if it is supposed that the subject of data write is the second non-volatile memory transistor M2, a first write voltage $V_{prg1}$ is applied to the word line WL, that is, the gate electrodes of the first and second non-volatile memory transistors M1 and M2, and a second write voltage $V_{prg2}$ that is smaller than the first write voltage $V_{prg1}$ is applied to the second data line BL2, and a third write voltage $V_{prg3}$ that is smaller than the second write voltage $V_{prg2}$ is applied to the first data line BL1.

That is, the voltage relationship during data write is $V_{prg1} > V_{prg2} > V_{prg3}$.

In the present example, it is configured so that $V_{prg1}$=10 V, $V_{prg2}$=3 V, and $V_{prg3}$=0 V.

In the present example, the non-volatile memory transistor shall be an N channel type. However, by reversing the sign of the voltage accordingly, it is possible to apply a P channel type to the present example.

Figure 9:
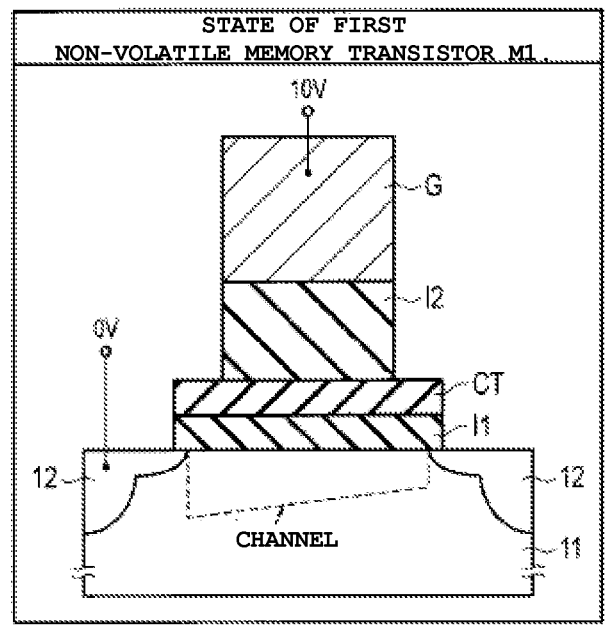
FIG. 9 is a diagram depicting a state of a non-selected non-volatile memory transistor at a time of write.
Figure 10:
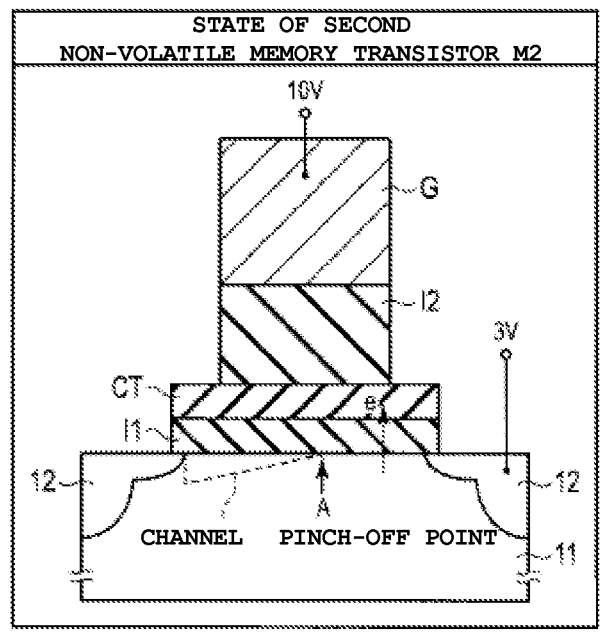
FIG. 10 is a diagram depicting a state of a selected non-volatile memory transistor at a time of write.

$V_{prg1}$ is made higher than the threshold voltage during the erase state of the first and second non-volatile memory transistors M1 and M2. In this case, as shown in FIG. 9 and FIG. 10, a channel is formed in the lower part of the lower part insulating film I1 of the first and second non-volatile memory transistors M1 and M2.

Also, $V_{prg1}$ is configured to be lower than the voltage under which FN (Fowler-Nordheim) tunneling current would be generated to the first and second non-volatile memory transistors M1 and M2. The FN tunneling current occurs, in the case of the gate structure of the present example, when $V_{prg1}$ is higher than 15 V, and becomes prominent when $V_{prg1}$ is higher than 18 V. That is, when $V_{prg1}$ is 10 V, FN tunneling current is not generated.

Therefore, neither the transfer of electrons from the channel to the charge storage film CT by the FN tunneling current, nor the transfer of electrons from the charge storage film CT to the gate electrode G occurs.

In the second non-volatile memory transistor M2, $V_{prg2}$ is configured to be a value that is sufficient so that a channel hot electron (CHE), which has an energy that surpasses the energy barrier of the lower part insulating film I1, can be generated. This value, in the case of the gate structure of the present example, is a voltage that is higher than 2 V, and preferably, is between 2.5 V and 3 V.

$V_{prg3}$ is configured to be a smaller value than $V_{prg2}$, for example, 0 V.

At this time, as shown in FIG. 9, a channel pinch-off is not generated at the first non-volatile memory transistor M1, and as shown in FIG. 10, a channel pinch-off is generated at the second non-volatile memory transistor M2.

At the second non-volatile memory transistor M2, a portion of the hot electrons generated in the neighborhood of the channel pinch-off goes over the energy barrier of the lower part insulating film I1, and is injected in the charge storage film CT and captured there.

As a result, only the threshold voltage of the second non-volatile memory transistor M2 rises, and changes from the erase state to the write state. In contrast, the first non-volatile memory transistor M1 maintains the erase state (low threshold value state).

Here, most of the voltage that is applied between the first and the second data lines BL1 and BL2 ($V_{prg2}$–$V_{prg3}$) is applied between the channel pinch-off point A and the second data line BL2, so the voltage of the common node Q becomes a value close to Vprg3 (for example 0 V). In the present example, the voltage of the common node Q during write is less than or equal to 1 V.

Meanwhile, in the example mentioned above, it is supposed that the subject of the data write is the second non-volatile memory transistor M2, but if it is supposed that the subject of the data write is the first non-volatile memory transistor M1, the first write voltage $V_{prg1}$ should be applied to the word line WL, the second write voltage $V_{prg2}$ should be applied to the first data line BL1, and the third write voltage $V_{prg3}$ should be applied to the second data line BL2.

Here, the switch transistor ST (for example, the switch transistor ST1 in FIG. 6) inside the logic transistor unit 10 is, for example, an FET with a thin gate insulating film, with a breakdown voltage of less than or equal to 2 V. The gate terminal of the switch transistor ST is connected to the common node Q, but, as mentioned above, the voltage that is applied to the common node Q during the write of the non-volatile programmable switch is less than or equal to 1 V. Therefore, the switch transistor ST will not be destroyed during write. That is, according to the write method of the present example, a high-speed switch transistor that has an ultrathin gate insulating film (for example, less than or equal to 2 nm) can be used. The speed performance of the switch transistor is one of the most important elements that decide the speed of the whole FPGA, and therefore the use of a high-speed switch transistor is advantageous.

(Erase Operation)

Figure 11:
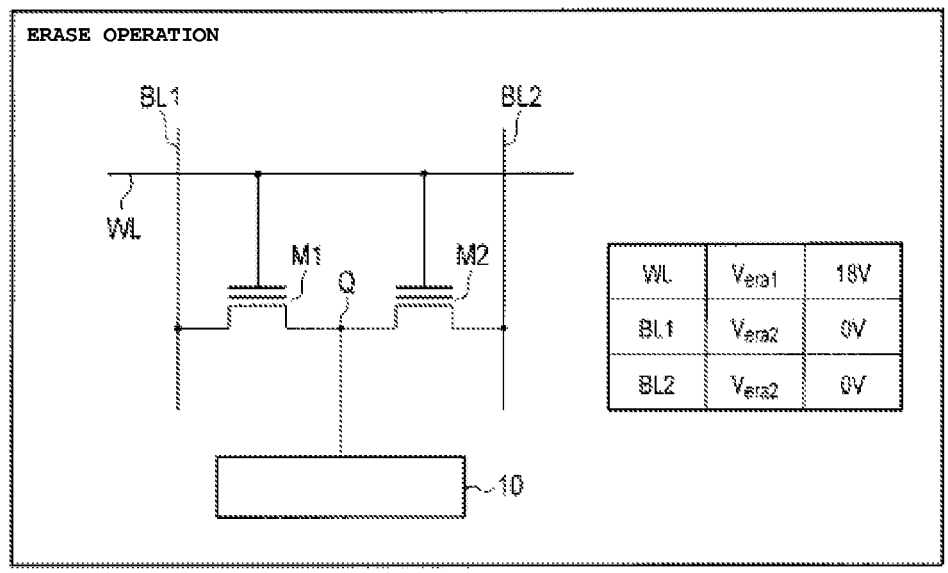
FIG. 11 is a diagram depicting an erase operation.

FIG. 11 shows the erase operation of the non-volatile programmable switch.

In the present example, data erase can be carried out at the same time on both the first and second non-volatile memory transistors M1 and M2, by the FN tunneling current between the charge storage film CT and the gate electrode G.

For example, during the erase operation, a first erase voltage $V_{era1}$ is applied to the word line WL, that is, to each of the gate electrodes of the first and second non-volatile memory transistors M1 and M2, and a second erase voltage $V_{era2}$ that is smaller than the first erase voltage $V_{era1}$ is applied to each of the first and second data lines BL1 and BL2.

That is, the voltage relationship during data erase is $V_{era1} > V_{era2}$.

In the present example, the device is configured so that $V_{era1}=18$ V, $V_{era2}=0$ V.

Here, according to the present example, it is possible to make the polarity of the voltage that is applied to the gate electrode G the same, in the write operation and the erase operation.

In the present example, the non-volatile memory transistors are an N channel type. However, by reversing the sign of the voltage accordingly, it is possible to apply a P channel type to the present example.

$V_{era1}$ is configured to be higher than the voltage under which the FN tunneling current would be generated in the first and second non-volatile memory transistors M1 and M2. As has already been explained, the FN tunneling current occurs, in the case of the gate structure of the present example, when $V_{era1}$ is higher than or equal to 15 V, and becomes prominent when $V_{era1}$ is higher than 18 V. Therefore, for example, $V_{era1}$ is set to be 18 V.

Therefore, the absolute value of $V_{era1}$ is larger than the absolute value of $V_{prg1}$.

Figure 12:
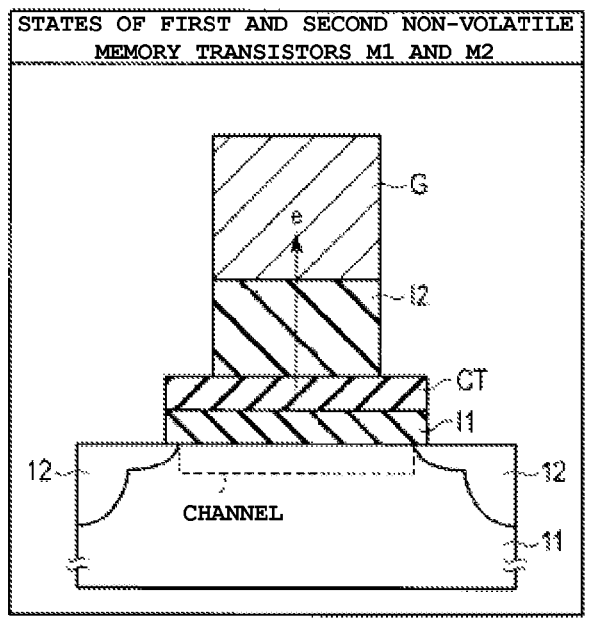
FIG. 12 is a diagram depicting the state of the non-volatile memory transistor at a time of erase.

At this time, as shown in FIG. 12, a channel is formed in the lower part of the lower part insulating film I1 of the first and second non-volatile memory transistors M1 and M2. Also, the electric field is applied in the direction that heads from the gate electrode G to the channel, and the electrons inside the charge storage film CT receives force in the direction heading from the channel to the gate electrode G.

And, due to this electric field, the electrons that are captured in the charge storage film CT are transferred to the gate electrode G. As a result, the threshold voltage of the first and second non-volatile memory transistors M1 and M2 falls, and goes back to the initial state of the erase state.

Erroneous write during erase operation means a rise in the threshold value due to the injection of electrons from the channel to the charge storage film CT. In order to prevent erroneous write, it becomes necessary for the relationship between an electric field F1 that is applied to the lower part insulating film I1 and an electric field F2 that is applied to the upper part insulating film I2 to satisfy (F2/F1)>1.

F2/F1 is represented by the following formula.

$$\frac{F_2}{F_1} = \frac{L_{ct}}{L_g} \frac{\varepsilon_1}{\varepsilon_2} \quad \text{[Formula 2]}$$

In the case of the gate structure of the present example, $\varepsilon_1=4.11$, $\varepsilon_2=4.97$, and $\varepsilon_1/\varepsilon_2$ is less than or equal to 1, that is 0.83. On the other hand, Lct=55 nm, Lg=35 nm, and Lct/Lg becomes 1.57. For this reason, F2/F1 becomes a value larger than 1, that is, 1.30.

In the case that F2 is larger than F1, the amount of electron outflow from the charge storage film CT to the gate electrode G becomes larger than the amount of electron inflow from the channel to the charge storage film CT. As a result, there is a net outflow of electrons from the charge storage film CT to the gate electrode G, and the electrons that are captured by the charge storage film CT are reduced, and the threshold voltage of the first and second non-volatile memory transistors M1 and M2 declines.

Meanwhile, according to Formula 2, it is clear that, in order to satisfy (F2/F1)>1, there needs to be the relationship ($\varepsilon_2/\varepsilon_1$)<(Lct/Lg). Therefore, even if Lct/Lg becomes less than or equal to 1, if it is larger than ε2/ε1, then the erase method of the present example can be carried out.

Figure 13:
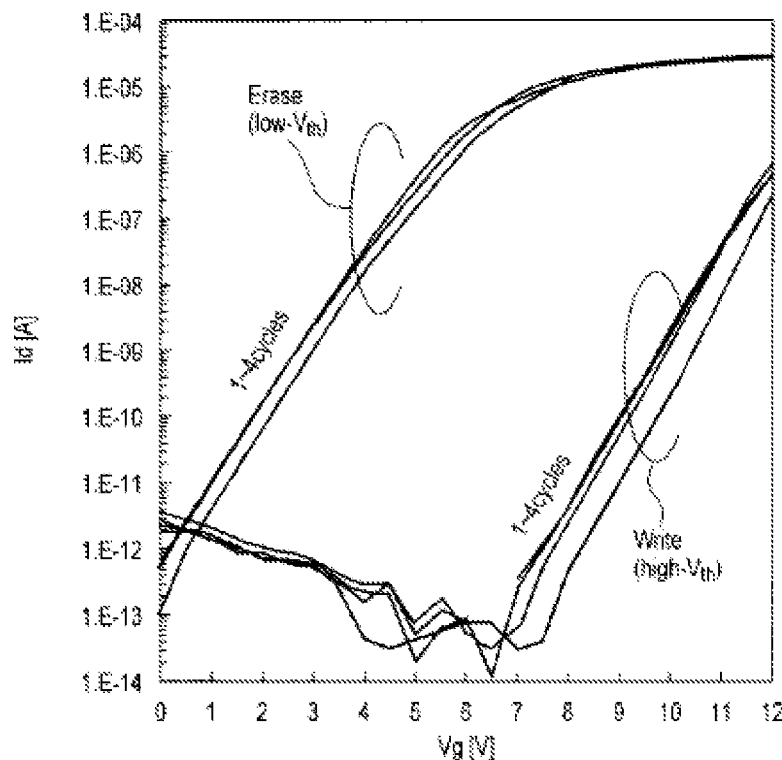
FIG. 13 is a chart of the write/erase characteristics.

FIG. 13 shows the write/erase characteristics of the non-volatile memory transistor according to the present example.

According to the FIG. 13, it can be seen that in a non-volatile memory transistor that is as minute as Lg=35 nm, good write/erase operations are being realized. In this case, the difference in the threshold voltages between the erase state and the write state ΔVth is 7.7 V.

In this way, in the present example, by having a configuration of Lct/Lg>1, erroneous write is prevented, and the erase operation is realized. Here, the ΔL that is necessary to realize a certain F2/F1 (>1) to prevent erroneous write becomes smaller as Lg becomes smaller. Therefore, the smaller the Lg is, the smaller the ΔL that is required to be realized in the slimming process. In this regard, the non-volatile programmable switch of the present disclosure can be easily miniaturized.

Here, the method of the selective erase is described.

Figure 14:
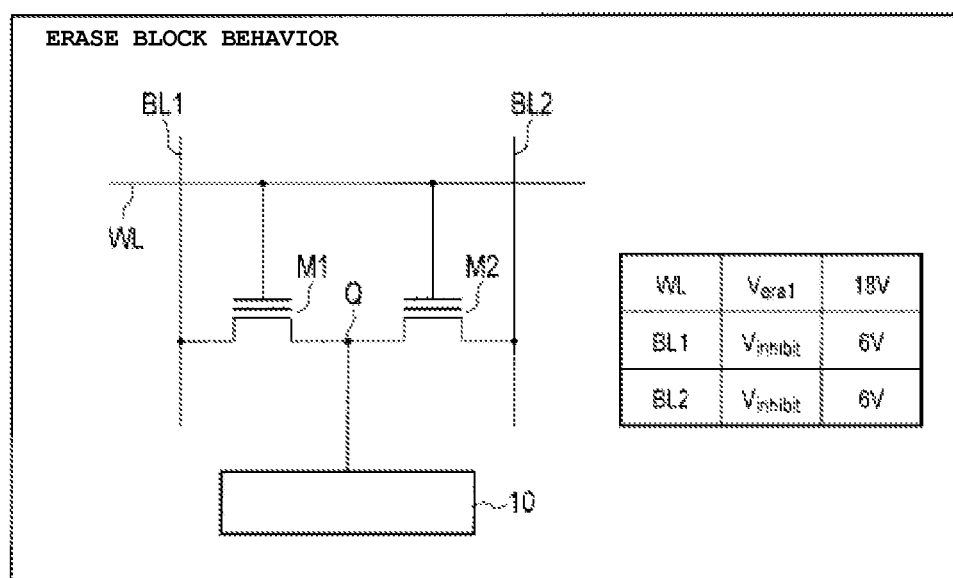
FIG. 14 is a diagram depicting an erase block operation.
Figure 15:
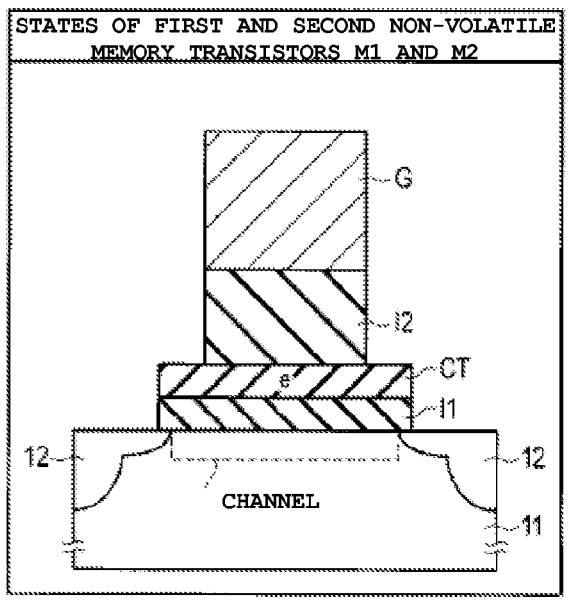
FIG. 15 is a diagram depicting a state of the non-volatile memory transistor at a time of erase block.

FIG. 14 and FIG. 15 show the erase block operation of the non-volatile programmable switch.

During the erase operation mentioned above, regarding a non-volatile programmable switch that shares a word line WL with a non-volatile programmable switch, which becomes the subject of the erase operation (select cell), and does not itself become a subject of the erase operation (nonselect cell), erase can be prevented by applying an erase inhibiting (erase blocking) voltage, $V_{inhibit}$, described below.

During the erase operation, regarding the nonselect cell, the first erase voltage $V_{era1}$ is applied to the word line WL, that is, to each of the gate electrodes of the first and second non-volatile memory transistors M1 and M2, and an erase blocking voltage $V_{inhibit}$ that is larger than the second erase voltage $V_{era2}$ is applied to each of the first and second data lines BL1 and BL2.

That is, the voltage relationship during data erase is $V_{era1} > V_{inhibit} > V_{era2}$.

For example, it can be configured so that $V_{era1}$=18 V, $V_{inhibit}$=6 V, and $V_{era2}$=0 V.

In the present example, the non-volatile memory transistor shall be an N channel type. However, by reversing the sign of the voltage accordingly, it is possible to apply a P channel type to the present example.

As shown in FIG. 15, a channel with the potential of the $V_{inhibit}$ is formed in the lower part of the lower part insulating film I1 of the non-volatile memory transistors M1 and M2 of the nonselect cell. The applied voltage between the gate/channel of the non-volatile memory transistor of the nonselect cell becomes ($V_{era1}-V_{inhibit}$). On the other hand, the applied voltage between the gate/channel of the non-volatile memory transistor of the select cell is ($V_{era1}-V_{era2}$). Therefore, the applied voltage between the gate/channel becomes smaller with the nonselect cell, and so an erase by the FN tunneling current can be avoided.

(FPGA Operation)

Figure 16:
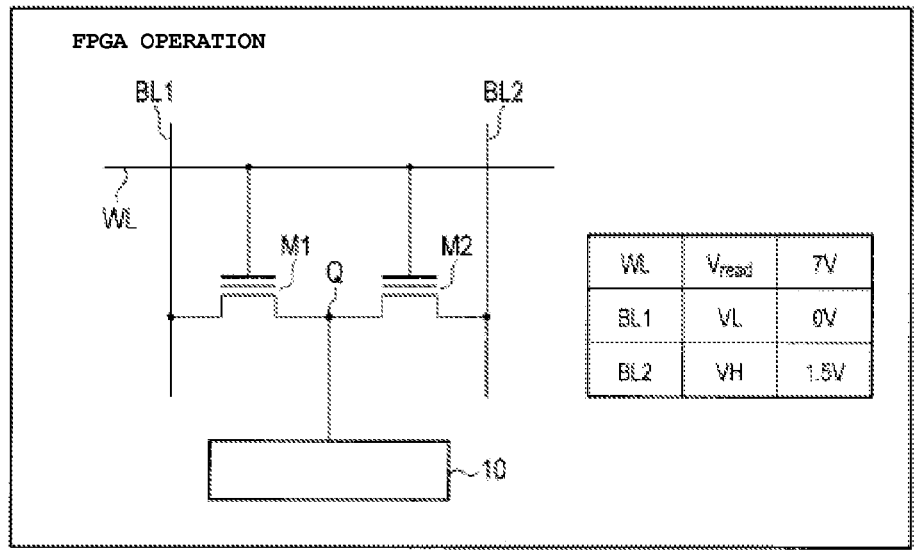
FIG. 16 is a diagram depicting an FPGA operation.

FIG. 16 shows the FPGA operation of the non-volatile programmable switch.

During FPGA operation, a read voltage $V_{read}$ is applied to the word line WL, that is, the gate electrode of the first and second non-volatile memory transistors M1 and M2. The read voltage $V_{read}$ is configured to be larger than the threshold voltage of the memory transistor in the erase state, and to be smaller than the threshold voltage of the memory transistor in a write state.

Also, applied to one of the data lines BL1 and BL2 is a high voltage (for example, power-supply voltage Vdd) VH as the "H" level, and applied to the other is a low voltage (for example ground voltage Vss) VL as the "L" level.

With this, the high voltage "H" or the low voltage "L" is transferred to the logic transistor unit 10, via, of the first and second non-volatile memory transistors M1 and M2, the memory transistor that is in the erase state.

For example, it can be configured so that $V_{read}$=7 V, VH=1.5 V, and VL=0 V.

In the present example, the non-volatile memory transistor shall be an N channel type. However, by reversing the sign of the voltage accordingly, it is possible to apply a P channel type to the present example.

In the present example, if it is assumed that the first non-volatile memory transistor M1 is in the erase state and that the second non-volatile memory transistor M2 is in the write state, by configuring the voltage relationships described above, the first non-volatile memory transistor M1 goes into the ON state, and the second non-volatile memory transistor M2 goes into the OFF state.

As a result, the voltage of the first data line BL1 (for example VL) is transferred to the logic transistor unit 10.

In contrast, if it is assumed that the first non-volatile memory transistor M1 is in the write state and that the second non-volatile memory transistor M2 is in the erase state, by configuring the voltage relationships described above, the first non-volatile memory transistor M1 goes into the OFF state and the second non-volatile memory transistor M2 goes into the ON state.

As a result, the voltage of the second data line BL2 (for example VH) is transferred to the logic transistor unit 10.

In this way, by programming the first and second non-volatile memory transistors M1 and M2 in a complementary style, VL or VH can be outputted from the common node Q.

Connected to the common node Q is, for example, the gate terminal of the switch transistor ST, as shown in FIG. 6. In the case that VL is outputted from the common node Q, the switch transistor ST (in the case that it is an N channel type FET) becomes the OFF state. On the other hand, in the case that VH is outputted from the common node Q, the switch transistor ST becomes the ON state. In this way, by programming the first and second non-volatile memory transistors M1 and M2 in a complementary style, it is possible to store the ON/OFF state of the switch transistor ST and to change between the states.

Meanwhile, in the present example, it is presumed that VL is applied to the data line BL1 and that VH is applied to the data line BL2, but it can have the reverse relationship, that is, VH can be applied to the data line BL1 and VL can be applied to the data line BL2.

Figure 17:
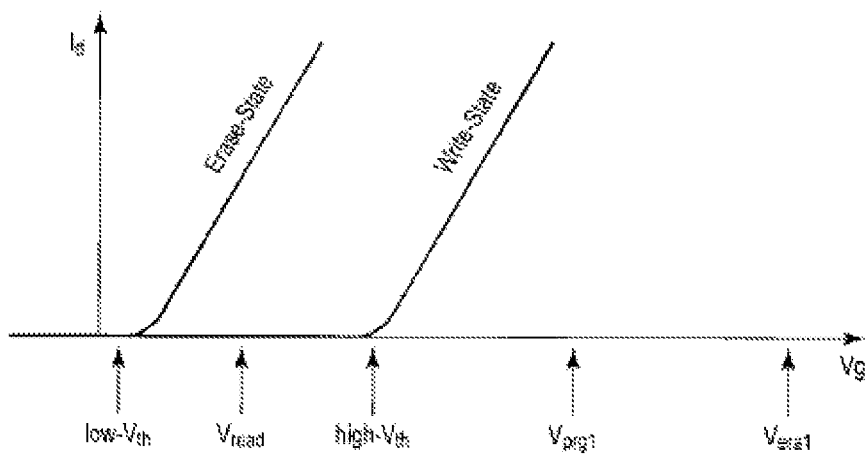
FIG. 17 is a chart of a relationship between Id-Vg characteristics and the write/erase/read voltages.

FIG. 17 shows the relationship between the Id-Vg characteristics of the non-volatile memory transistor and the write/erase/read voltages.

As shown in the same drawing, in the write/erase/read operations, the gate electrodes of the first and second non-volatile memory transistor M1 and M2 (that is, the word line WL) need only to be applied with the voltages $V_{prg1}$, $V_{era1}$, and $V_{read}$ with the same polarities.

Therefore, according to the present example, compared to technology in which voltages with different polarities must be applied to the gate electrodes of the first and second non-volatile memory transistors M1 and M2, the configuration of the driver (voltage-control circuit) for the write/erase/read operations can be simplified. With this, the area of the FPGA can be made small, and keep the manufacturing cost down.

Also, in the present example, in the write/erase/read operations, controlling the substrate bias is not necessarily required. That is, it is also possible to always keep the substrate potential (or the well potential) constant (for example, 0 V). For this reason, compared to methods that necessitate the substrate bias control upon erase or write, the configuration of FPGA can be simplified.

Figure 18:
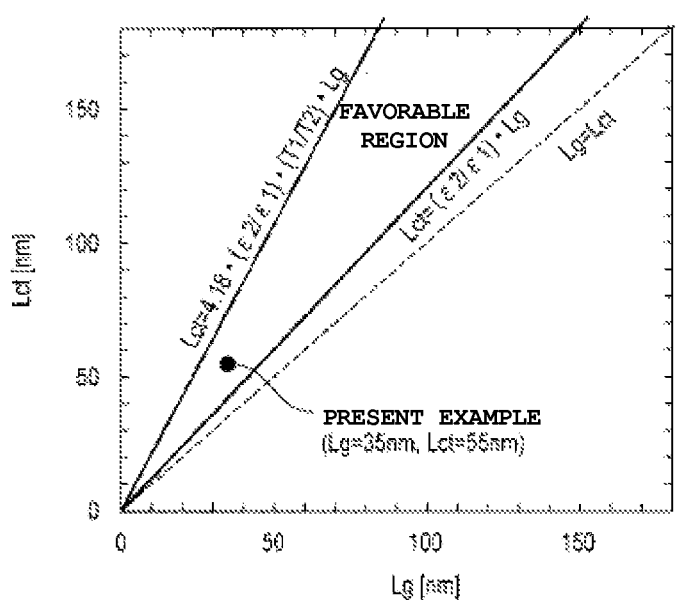
FIG. 18 is a diagram of a preferred region of Lg and Lct.

FIG. 18 shows the favorable range for the length Lct of the charge storage film CT in the channel longitudinal direction in respect to the length Lg of the gate electrode G in the channel longitudinal direction.

The lower limit of the favorable region is deduced from the conditions required to prevent erroneous write during erase. Specifically, it becomes:

$$L_{ct} > \frac{\varepsilon_2}{\varepsilon_1} L_g \quad \text{[Formula 3]}$$

As has already been mentioned, in order to prevent erroneous writes during erase, (F2/F1)>1 should be satisfied. With this condition and Formula 2, Formula 3 can be derived.

On the other hand, the upper limit of the favorable region is derived from the conditions to realize sufficient write amounts (charge storage) during write. Specifically, it is as follows:

$$L_{ct} < 4.18 \frac{\varepsilon_2}{\varepsilon_1} \frac{T_2}{T_1} L_g \quad \text{[Formula 4]}$$

As has already been mentioned, the increase of Lct/Lg is favorable from the view point of preventing erroneous write at the time of erase. However, if Lct/Lg is too large, the voltage that is applied to the lower part insulating film I1 during the write operation becomes small, and there are cases where the inflow amount of electrons to the charge storage film CT becomes insufficient (cases where the write amount becomes insufficient). Thus, with the aim to not allow the generation of this kind of insufficient write, the upper limit of the favorable region is decided.

The voltage Vct that is applied to the charge storage film CT at the time of data write is given as Vct=Rc×$V_{prg1}$, if the capacitive coupling ratio (coupling ratio) of the charge storage film CT is Rc.

Here, Rc is represented by the following formula:

$$R_c = \frac{1}{\left( \frac{L_{ct}}{L_g} \frac{\varepsilon_1}{\varepsilon_2} \frac{T_2}{T_1} + 1 \right)} \quad \text{[Formula 5]}$$

Figure 19:
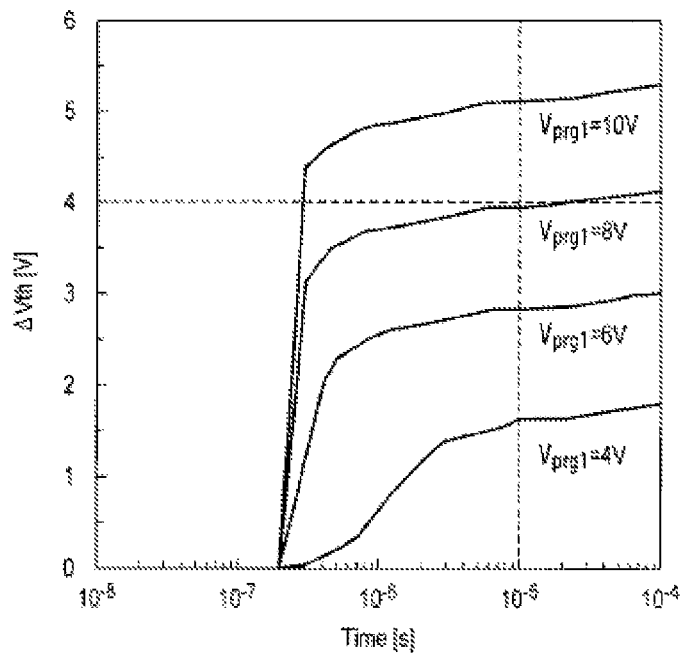
FIG. 19 is a graph showing the variation in threshold voltage due to CHE write for different values of Vprg1.

FIG. 19 is the theoretical computation results showing the change amount ΔVth of the threshold voltage due to the CHE write when Rc=0.34 for different values of $V_{prg1}$. It is desirable for the write time of the non-volatile programmable switch to be less than or equal to 10 μsec, and desirable for the change amount ΔVth of the threshold voltage to exceed 4 V. For this, $V_{prg1}$>8 V must be satisfied.

When $V_{prg1}$=8 V, Vct is 2.70 V. Since $V_{prg1}$ needs to be smaller than $V_{era1}$, the maximum value of $V_{prg1}$ is 14 V. From the condition that, when $V_{prg1}$=14 V then Vct>2.70 V, the minimum required Rc (Rcmin) is calculated, it becomes 0.19. With the condition Rc>0.19 and the Formula 5, Formula 4 may be obtained.

(Differences from High-Capacity File Memory—Configuration and Erase Method)

In the present example, the channel width of the first non-volatile memory transistor M1 is larger than the channel length of the first non-volatile memory transistor M1, and the channel width of the second non-volatile memory transistor M2 is larger than the channel length of the second non-volatile memory transistor M2.

At the time of FPGA operation, since the signal of the logic unit is transferred to the common node Q via the fringe capacitance of the switch transistor, the operation of the programmable switch might become unstable. Here, fringe capacitance is a parasitic capacitance between gate and source/drain electrodes. By augmenting the current drive force of the non-volatile memory transistor, the potential of the common node Q can be stabilized. For this, it is effective to increase the channel width of the non-volatile memory transistor.

On the other hand, for the application of high-capacity file memory, in order to minimize the cell area, it is normally designed so that the channel length and the channel width of the non-volatile memory transistor would both have the minimum feature dimension (critical dimension).

The non-volatile memory transistor of a high-capacity file memory shall have a structure in which the gate electrode covers the charge storage film CT in the channel width direction (high-coupling structure) in order to improve the capacitive coupling between the charge storage film CT and the gate electrode G. Erase is carried out by the FN tunneling current between the charge storage film CT and the channel (channel erase). In high-capacity file memory, since the channel length and the channel width is of the same dimensions, the effect of high-coupling structure is significant.

On the other hand, in order to decrease the capacitive coupling of the charge storage film CT and the gate electrode G, the non-volatile memory transistor of the non-volatile programmable switch according to the present example is configured so that the length Lg of the gate electrode in the gate longitudinal direction is smaller than the length Lct of the charge storage film (low coupling structure). Erase is carried out by the FN tunneling current between the charge storage film CT and the gate electrodes (gate erase). In the non-volatile memory transistor of the non-volatile programmable switch, the effect of low coupling structure is significant, because the channel width is larger than the channel length.

According to this embodiment, a configuration of a non-volatile programmable switch that can achieve good write/erase characteristics even if they are miniaturized, as well as the method of write/erase on that non-volatile programmable switch can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile programmable switch, comprising:
    a first non-volatile memory transistor that includes a first input side terminal, a first output side terminal, a first channel between the first input side terminal and the first output side terminal, a first lower part insulating film on the first channel, a first charge storage film on the first lower part insulating film, a first upper part insulating film on the first charge storage film, and a first gate electrode on the first upper part insulating film;

a second non-volatile memory transistor that includes a second input side terminal, a second output side terminal, a second channel between the second input side terminal and the second output side terminal, a second lower part insulating film on the second channel, a second charge storage film on the second lower part insulating film, a second upper part insulating film on the second charge storage film, and a second gate electrode on the second upper part insulating film;

a first data line that is connected to the first input side terminal;

a second data line that is connected to the second input side terminal;

a common node that is commonly connected to the first and second output side terminals; and a logic transistor unit that is connected to the common node, wherein a length of the first gate electrode in a channel longitudinal direction is shorter than a length of the first charge storage film in the channel longitudinal direction;

a length of the second gate electrode in the channel longitudinal direction is shorter than a length of the second charge storage film in the channel longitudinal direction;

a channel width of the first non-volatile memory transistor is greater than a channel length of the first non-volatile memory transistor; and a channel width of the second non-volatile memory transistor is greater than a channel length of the second non-volatile memory transistor.

2. The non-volatile programmable switch of claim 1, wherein when a length of the first charge storage film in the channel longitudinal direction is Lct, a length of the first gate electrode in the channel longitudinal direction is Lg, an average relative permittivity of the first lower part insulating film is $\epsilon 1$, and an average relative permittivity of the first upper part insulating film is $\epsilon 2$, a relationship $(\epsilon 2/\epsilon 1) < (Lct/Lg)$ is satisfied.

3. The non-volatile programmable switch according to claim 1, wherein the logic transistor unit includes a field effect transistor (FET) having a gate electrode connected to the common node.

4. The non-volatile programmable switch according to claim 1, wherein the logic transistor unit includes a field effect transistor (FET) having one of a source terminal and a drain terminal connected to the common node.

5. The non-volatile programmable switch according to claim 1, wherein the first gate electrode and the second gate electrode are connected to a same word line.

6. The non-volatile programmable switch according to claim 1, wherein the first and second charge storage films comprise silicon nitride.

7. The non-volatile programmable switch according to claim 1, further comprising:
a driver configured to apply a voltage having a same polarity to each of the first and second gate electrodes during a write operation and an erase operation.

8. The non-volatile programmable switch according to claim 1, wherein, when the length of the first charge storage film in the channel longitudinal direction is Lct, the length of the first gate electrode in the channel longitudinal direction is Lg, an average relative permittivity and a film thickness of the first lower part insulating film are $\epsilon 1$ and T1, respectively, and an average relative permittivity and a film thickness of the first upper part insulating film are $\epsilon 2$ and T2, respectively, a relationship $(Lct/Lg) < 4.18 \times (\epsilon 2/\epsilon 1) \times (T1/T2)$ is satisfied.

9. The non-volatile programmable switch according to claim 2, wherein a film thickness of the first lower part insulating film is T1, and a film thickness of the first upper part insulating film is T2 a relationship $(Lct/Lg) < 4.18 \times (\epsilon 2/\epsilon 1) \times (T1/T2)$ is satisfied.

10. A non-volatile programmable switch, comprising:
a first non-volatile memory transistor that includes a first input side terminal, a first output side terminal, a first channel between the first input side terminal and the first output side terminal, a first lower part insulating film on the first channel, a first charge storage film on the first lower part insulating film, a first upper part insulating film on the first charge storage film, and a first gate electrode on the first upper part insulating film;

a second non-volatile memory transistor that includes a second input side terminal, a second output side terminal, a second channel between the second input side terminal and the second output side terminal, a second lower part insulating film on the second channel, a second charge storage film on the second lower part insulating film, a second upper part insulating film on the second charge storage film, and a second gate electrode on the second upper part insulating film;

a first data line that is connected to the first input side terminal;

a second data line that is connected to the second input side terminal;

a common node that is commonly connected to the first and second output side terminals; and a logic transistor unit that is connected to the common node, wherein a length of the first gate electrode in a channel longitudinal direction is shorter than a length of the first charge storage film in the channel longitudinal direction;

a length of the second gate electrode in the channel longitudinal direction is shorter than a length of the second charge storage film in the channel longitudinal direction;

wherein when a length of the first charge storage film in the channel longitudinal direction is Lct, a length of the first gate electrode in the channel longitudinal direction is Lg, an average relative permittivity of the first lower part insulating film is $\epsilon 1$, and an average relative permittivity of the first upper part insulating film is $\epsilon 2$, a relationship $(\epsilon 2/\epsilon 1) < (Lct/Lg)$ is satisfied.

11. The non-volatile programmable switch according to claim 10, wherein a film thickness of the first lower part insulating film is T1, and a film thickness of the first upper part insulating film is T2 a relationship $(Lct/Lg) < 4.18 \times (\epsilon 2/\epsilon 1) \times (T1/T2)$ is satisfied.

12. A non-volatile programmable switch, comprising:
a first non-volatile memory transistor that includes a first input side terminal, a first output side terminal, a first channel between the first input side terminal and the first output side terminal, a first lower part insulating film on the first channel, a first charge storage film on the first lower part insulating film, a first upper part insulating film on the first charge storage film, and a first gate electrode on the first upper part insulating film;

a second non-volatile memory transistor that includes a second input side terminal, a second output side terminal, a second channel between the second input side terminal and the second output side terminal, a second lower part insulating film on the second channel, a second charge storage film on the second lower part insulating film, a second upper part insulating film on the second charge storage film, and a second gate electrode on the second upper part insulating film;
a first data line that is connected to the first input side terminal;
a second data line that is connected to the second input side terminal;
a common node that is commonly connected to the first and second output side terminals; and
a logic transistor unit that is connected to the common node, wherein
a length of the first gate electrode in a channel longitudinal direction is shorter than a length of the first charge storage film in the channel longitudinal direction;
a length of the second gate electrode in the channel longitudinal direction is shorter than a length of the second charge storage film in the channel longitudinal direction;
wherein, when the length of the first charge storage film in the channel longitudinal direction is Lct, the length of the first gate electrode in the channel longitudinal direction is Lg, an average relative permittivity and a film thickness of the first lower part insulating film are $\epsilon 1$ and T1, respectively, and an average relative permittivity and a film thickness of the first upper part insulating film are $\epsilon 2$ and T2, respectively, a relationship (Lct/Lg)<4.18×($\epsilon 2/\epsilon 1$)×(T1/T2) is satisfied.

* * * * *